(12) United States Patent
Zhao et al.

(10) Patent No.: US 11,956,991 B2
(45) Date of Patent: Apr. 9, 2024

(54) DISPLAY PANEL, METHOD FOR MANUFACTURING THE SAME AND DISPLAY DEVICE

(71) Applicant: BOE TECHNOLOGY GROUP CO., LTD., Beijing (CN)

(72) Inventors: Jin Zhao, Beijing (CN); Fudong Chen, Beijing (CN); Kang Guo, Beijing (CN); Xueyuan Zhou, Beijing (CN); Mengya Song, Beijing (CN); Yanhui Lu, Beijing (CN); Duohui Li, Beijing (CN); Ning Dang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 226 days.

(21) Appl. No.: 17/460,734

(22) Filed: Aug. 30, 2021

(65) Prior Publication Data
US 2022/0102683 A1 Mar. 31, 2022

(30) Foreign Application Priority Data
Sep. 30, 2020 (CN) .......................... 202011067656.7

(51) Int. Cl.
*H10K 50/85* (2023.01)
*H10K 71/00* (2023.01)
(Continued)

(52) U.S. Cl.
CPC ............ *H10K 50/85* (2023.02); *H10K 71/00* (2023.02); *H10K 59/1201* (2023.02);
(Continued)

(58) Field of Classification Search
CPC .... H10K 50/85; H10K 71/00; H10K 59/1201; H10K 59/122; H10K 2102/3026; H10K 2102/3023
(Continued)

(56) References Cited

U.S. PATENT DOCUMENTS

| | | | | |
|---|---|---|---|---|
| 2001/0035713 | A1* | 11/2001 | Kimura | H10K 50/854 313/506 |
| 2005/0077820 | A1* | 4/2005 | Onishi | H10K 50/854 313/506 |

(Continued)

FOREIGN PATENT DOCUMENTS

CN 110333565 10/2019

*Primary Examiner* — Dzung Tran
(74) *Attorney, Agent, or Firm* — Dority & Manning, PA

(57) ABSTRACT

A display panel includes a substrate and a grating disposed on a light-emitting side of the display panel. The grating includes a plurality of protruding portions and a plurality of interval portions, each interval portion is located between two adjacent protruding portions. The plurality of protruding portions are arranged on the substrate along a first direction, and each protruding portion extends along a second direction perpendicular to the first direction. Each protruding portion includes an outer surface and a bottom surface; the outer surface is a smooth curved surface, and the bottom surface is a flat surface. A cross-sectional figure of each protruding portion along a thickness direction of the display panel is a first figure; the first figure includes a curve and a bottom edge, and the first figure is a closed figure formed by the curve and the bottom edge. The curve is a cross-sectional figure of the outer surface along the thickness direction of the display panel, and the bottom edge is a cross-sectional figure of the bottom surface along the thickness direction of the display panel.

16 Claims, 9 Drawing Sheets

(51) Int. Cl.
  *H10K 59/12*      (2023.01)
  *H10K 59/122*     (2023.01)
  *H10K 102/00*     (2023.01)

(52) U.S. Cl.
  CPC ... *H10K 59/122* (2023.02); *H10K 2102/3023* (2023.02); *H10K 2102/3026* (2023.02)

(58) Field of Classification Search
  USPC .......................................................... 257/72
  See application file for complete search history.

(56) References Cited

U.S. PATENT DOCUMENTS

| | | | |
|---|---|---|---|
| 2009/0185275 A1* | 7/2009 | Liu ................... | H01L 27/14625 |
| | | | 359/586 |
| 2015/0076468 A1* | 3/2015 | Yamaguchi ........... | B32B 37/025 |
| | | | 156/247 |
| 2016/0231478 A1* | 8/2016 | Kostamo .............. | G02B 5/1819 |
| 2017/0012169 A1* | 1/2017 | Seki ........................ | H01L 33/20 |
| 2017/0217831 A1* | 8/2017 | Hart .................... | C03C 17/2453 |
| 2019/0018186 A1* | 1/2019 | Fattal ................... | G02F 1/1336 |
| 2020/0259123 A1* | 8/2020 | Yang ...................... | G02B 30/22 |

\* cited by examiner

DISPLAY PANEL, METHOD FOR MANUFACTURING THE SAME AND DISPLAY DEVICE

CROSS-REFERENCE TO RELATED APPLICATION

This application claims priority to Chinese Patent Application No. 202011067656.7 filed on Sep. 30, 2020, which is incorporated herein by reference in its entirety.

TECHNICAL FIELD

The present disclosure relates to the field of display technologies, and in particular, to a display panel, a method for manufacturing the same, and a display device.

BACKGROUND

With the rapid development of science and technology and the continuous progress of display technology, display devices such as liquid crystal display (LCD) devices, organic light-emitting diode (OLED) display devices, and quantum dot light-emitting diode (QLED) display devices are all developing towards lower power consumption, quicker response, higher screen color saturation, higher luminous efficiency, longer service life, narrower bezel, and adaptation to wider temperature range, so as to satisfy the increasingly high usage requirements of users.

SUMMARY

In one aspect, a display panel is provided. The display panel includes a substrate and a grating disposed on a light-emitting side of the display panel. The grating includes a plurality of protruding portions and interval portions located between any two adjacent protruding portions. The plurality of protruding portions are arranged along a first direction of the substrate, and each protruding portion extends along a second direction perpendicular to the first direction. Each protruding portion includes an outer surface and a bottom surface; the outer surface is a smooth curved surface, and the bottom surface is a flat surface. A cross-sectional figure of each protruding portion along a thickness direction of the display panel is a first figure; the first figure includes a curve and a bottom edge, and the first figure is a closed figure formed by the curve and the bottom edge. The curve is a cross-sectional figure of the outer surface along the thickness direction of the display panel, and the bottom edge is a cross-sectional figure of the bottom surface along the thickness direction of the display panel.

In some embodiments, an included angle θ between a tangent to any point on the curve and any straight line in the thickness direction of the display panel is greater than or equal to 5° and less than 90° (5°≤θ<90°).

In some embodiments, each protruding portion includes a first protruding portion and a second protruding portion, and an orthographic projection of the first protruding portion on the substrate is located within an orthographic projection of the second protruding portion on the substrate. The grating includes a first pattern layer and a second pattern layer; the first pattern layer includes a plurality of first protruding portions, and the second pattern layer includes a plurality of second protruding portions.

In some embodiments, the first protruding portion includes a first bottom surface and two side surfaces. A cross-sectional figure of the first protruding portion along the thickness direction of the display panel is a second figure; the second figure includes a first bottom edge and two side edges, and the first bottom edge and the two side edges form a triangle. The first bottom edge is a cross-sectional figure of the first bottom surface along the thickness direction of the display panel, and the two side edges are cross-sectional figures of the two side surfaces along the thickness direction of the display panel.

In some embodiments, the second protruding portion includes the outer surface of a corresponding protruding portion, an inner surface proximate to the first protruding portion, and a second bottom surface. The inner surface is in contact with and covers the two side surfaces of the first protruding portion. A cross-sectional figure of the second protruding portion along the thickness direction of the display panel is a third figure, and the third figure includes the curve, an inner edge, and a second bottom edge. The second bottom edge is a cross-sectional figure of the second bottom surface along the thickness direction of the display panel, and the inner edge is a cross-sectional figure of the inner surface along the thickness direction of the display panel.

In some embodiments, the bottom surface of the protruding portion includes the first bottom surface and the second bottom surface, and the first bottom surface and the second bottom surface are located in a same plane.

In some embodiments, a ratio of a thickness $h3$ of the protruding portion to a width $D3$ thereof is greater than or equal to 1 and less than or equal to 5 ($1 \leq h3/D3 \leq 5$).

In some embodiments, a ratio of a thickness $h1$ of the first protruding portion to a width $D1$ thereof is equal to the ratio of the thickness $h3$ of the protruding portion to the width $D3$ thereof.

In some embodiments, a refractive index of the first protruding portion is less than a refractive index of the second protruding portion.

In some embodiments, a constituent material of the first protruding portion is silicon oxide.

In some embodiments, a constituent material of the second protruding portion includes at least one of silicon nitride, titanium dioxide, or aluminum oxide.

In some embodiments, the display panel further includes pixel circuits, a pixel defining layer, and light-emitting devices. The pixel circuit includes at least one thin film transistor disposed on the substrate. The pixel defining layer is located on a side of the at least one thin film transistor away from the substrate and includes a plurality of opening regions. The light-emitting devices are electrically connected to the pixel circuits, and one light-emitting device is disposed in one opening region. The light-emitting device includes at least a first electrode, a light-emitting functional layer and a second electrode that are arranged in sequence in a direction moving away from the substrate.

In some embodiments, the light-emitting devices are of a bottom-emission type, and the grating is disposed between the substrate and the at least one thin film transistor.

In some embodiments, the light-emitting devices are of a top-emission type, and the grating is disposed on a side of the second electrode away from the light-emitting functional layer.

In another aspect, a display device is provided. The display device includes the display panel as described above.

In still another aspect, a method for manufacturing a display panel is provided. The method includes fabricating a grating. Fabricating the grating includes: providing a debossing template with a debossing pattern; forming a first film layer and a debossing adhesive layer; debossing the debossing adhesive layer by using the debossing template to form a debossed pattern; etching the first film layer by using the debossed pattern as a mask to form a first pattern layer; and forming a second pattern layer on the first pattern layer so as to form the grating.

In some embodiments, the method further includes: forming the grating on a substrate, and forming the first film layer and the debossing adhesive layer on the substrate; forming at least one thin film transistor on a side of the grating away from the substrate; forming a pixel defining layer on a side of the at least one thin film transistor away from the substrate, the pixel defining layer including a plurality of opening regions; and forming light-emitting devices, one light-emitting device being disposed in one opening region.

In some embodiments, the method further includes: forming at least one thin film transistor on a substrate; forming a pixel defining layer on a side of the at least one thin film transistor away from the substrate, the pixel defining layer including a plurality of opening regions; forming light-emitting devices, one light-emitting device being disposed in one opening region; and forming the grating on a side of the light-emitting devices away from the substrate, and forming the first film layer and the debossing adhesive layer on the light-emitting devices.

In some embodiments, the debossing template includes a plurality of first rectangular portions, and an interval exists between any two adjacent first rectangular portions. The debossed pattern obtained by using the debossing template includes a plurality of second rectangular portions and a flat portion located between the plurality of second rectangular portions and the first film layer, and the plurality of second rectangular portions are in one-to-one correspondence with a plurality of intervals between the plurality of first rectangular portions.

In some embodiments, etching the first film layer by using the debossed pattern as the mask to form the first pattern layer includes: in a first etching stage, etching away portions of the flat portion corresponding to intervals between the plurality of second rectangular portions; and in a second etching stage, etching away remaining portions of the flat portion and the first film layer to form the first pattern layer.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, but are not limitations on an actual size of a product, an actual process of a method and an actual timing of a signal involved in the embodiments of the present disclosure.

DETAILED DESCRIPTION

Figure 1:
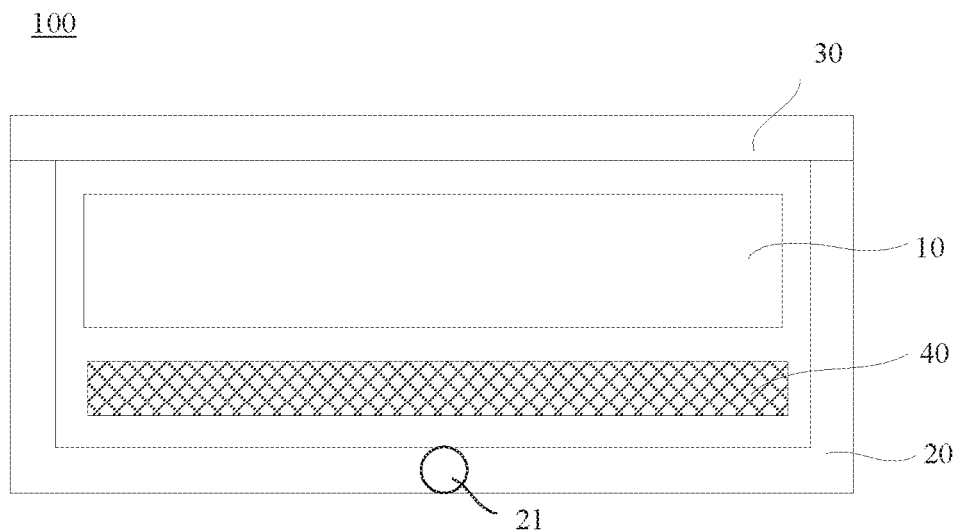
FIG. 1 is a structural diagram of a display device, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e. "including, but not limited to." In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Below, the terms "first" and "second" are only used for descriptive purposes, and are not to be construed as indicating or implying the relative importance or implicitly indicating the number of indicated technical features. Thus, a feature defined with "first" or "second" may explicitly or implicitly includes one or more of the features. In the description of the embodiments of the present disclosure, the term "a plurality of/the plurality of" means two or more unless otherwise specified.

In the description of some embodiments, the terms "coupled", "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C. The phrase "A and/or B" includes the following three combinations: only A, only B, and a combination of A and B.

As used herein, the term "if" is optionally construed as "when" or "in a case where" or "in response to determining that" or "in response to detecting", depending on the context. Similarly, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]", depending on the context.

The phrase "applicable to" or "configured to" as used herein indicates an open and inclusive expression, which does not exclude devices that are applicable to or configured to perform additional tasks or steps.

In addition, the phrase "based on" as used herein is meant to be open and inclusive, since a process, step, calculation or other action that is "based on" one or more of the stated conditions or values may, in practice, be based on additional conditions or values exceeding those stated.

As used herein, the terms such as "about", "substantially" or "approximately" include a stated value and an average value that is within an acceptable deviation range of a specific value. The acceptable deviation range is determined by a person of ordinary skill in the art in view of the measurement in question and errors associated with the measurement of a particular amount (i.e., limitations of a measurement system).

Exemplary embodiments are described herein with reference to sectional views and/or plan views as idealized exemplary drawings. In the accompanying drawings, thicknesses of layers and regions are enlarged for clarity. Therefore, variations in shape with respect to the drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature of being curved. Therefore, the regions shown in the accompanying drawings are schematic in nature, and their shapes are not intended to show actual shapes of the region in a device, and are not intended to limit the scope of the exemplary embodiments.

Some embodiments of the present disclosure provide a display device. The display device may be a TV, a mobile phone, a tablet computer, a notebook computer, a personal digital assistant (FDA), or a vehicle-mounted computer, etc. Embodiments of the present disclosure do not limit a type of the display device. For example, the display device may be a liquid crystal display (LCD) device, or a self-luminous display device. In a case where the display device is a self-luminous display device, the display device may be an organic light-emitting diode (OLED) display device, or a quantum dot light-emitting diode (QLED) display device, etc. OLED display devices have many advantages such as light weight, small thickness, high luminous efficiency, foldable and curlable design, low power consumption, and quick response. The following description is made by taking an example where the display device is an OLED display device.

As shown in FIG. 1, a display device 100 includes a display panel 10, a frame 20, a cover plate 30, a circuit board 40 and other electronic components. A longitudinal section of the frame 20 is U-shaped. The display panel 10, the circuit board 40 and other electronic components are all disposed in the frame 20. The circuit board 40 is disposed behind the display panel 10. The cover plate 30 is disposed on a side of the display panel 10 away from the circuit board 40.

The cover substrate 30 may be rigid or flexible. A constituent material of a rigid cover plate 30 may be glass. A constituent material of a flexible cover plate 30 may be polyimide (PI), etc. In this case, the frame 20 may be a foldable frame. As shown in FIG. 1, the foldable frame 20 includes a rotating shaft 21, so that the display device 100 may be folded along the rotating shaft 21.

Figure 2:
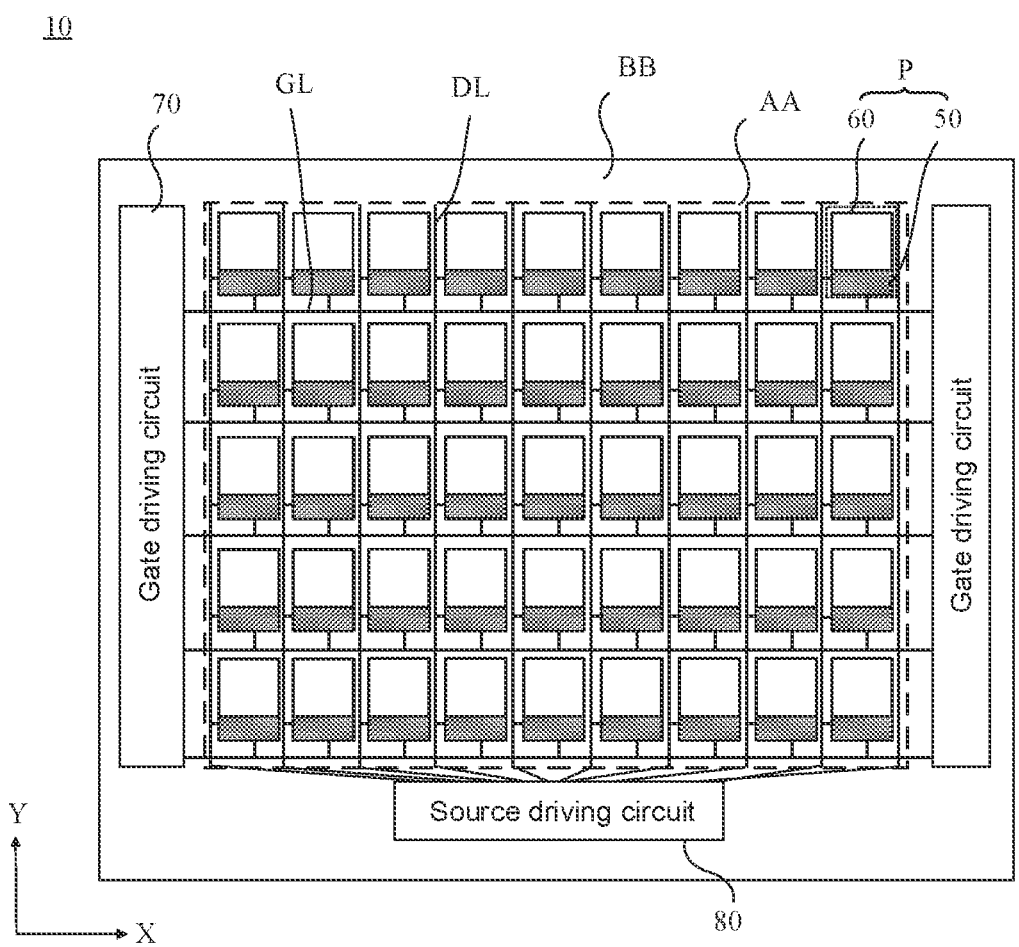
FIG. 2 is a plan view of a display panel, in accordance with some embodiments.

As shown in FIG. 2, observing from a display surface that directly faces the display panel 10, it can be seen that the display panel 10 has a display area AA (Active Area) and a peripheral area BB located on at least one side of the display area AA. FIG. 2 illustrates an example where the peripheral area BB surrounds the display area AA, but the present disclosure is not limited thereto.

The display area AA may include a plurality of sub-pixels P. For convenience of explanation, the following description is made by taking an example where the plurality of sub-pixels P are arranged in a matrix. Sub-pixels P arranged in the same row along a horizontal direction X are referred to as sub-pixels in a same row, and sub-pixels P arranged in the same row along a vertical direction Y are referred to as sub-pixels in a same column.

As shown in FIG. 2, each sub-pixel P includes a pixel circuit 50 and a light-emitting device 60 electrically connected to the pixel circuit 50. The pixel circuit 50 is able to drive the light-emitting device 60 electrically connected thereto to emit light. In this case, light-emitting devices 60 in the plurality of sub-pixels P may emit light of at least three primary colors, e.g., red (R) light, green (G) light, and blue (B) light.

The peripheral area BB in FIG. 2 includes a source driving circuit 80, a plurality of signal leads, and at least one gate driving circuit 70 located on at least one side of the display area AA. FIG. 2 illustrates an example where the gate driving circuits 70 are located on both left and right sides of the display area AA and the plurality of sub-pixels P in the display area AA are connected to the gate driving circuits 70 and the source driving circuit 80 through the plurality of signal leads. In some embodiments, the gate driving circuit 70 is arranged in the peripheral area BB by using the gate driver on array (GOA) technology, so as to reduce a size of the peripheral area BB and realize narrow-bezel design of the display device 100.

Figure 3A:
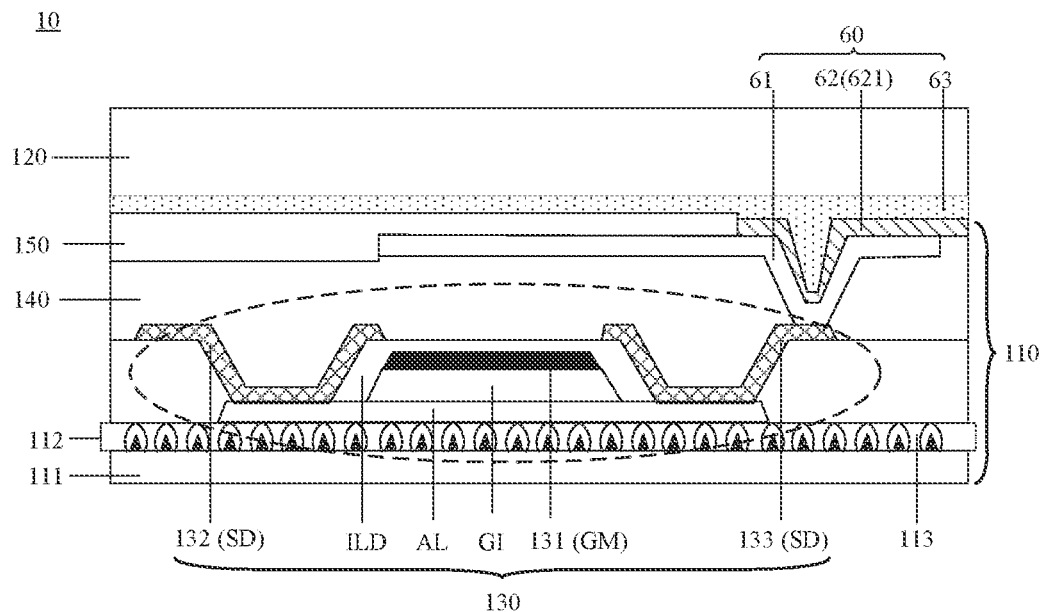
FIG. 3A is a structural diagram of a display panel, in accordance with some embodiments.
Figure 3B:
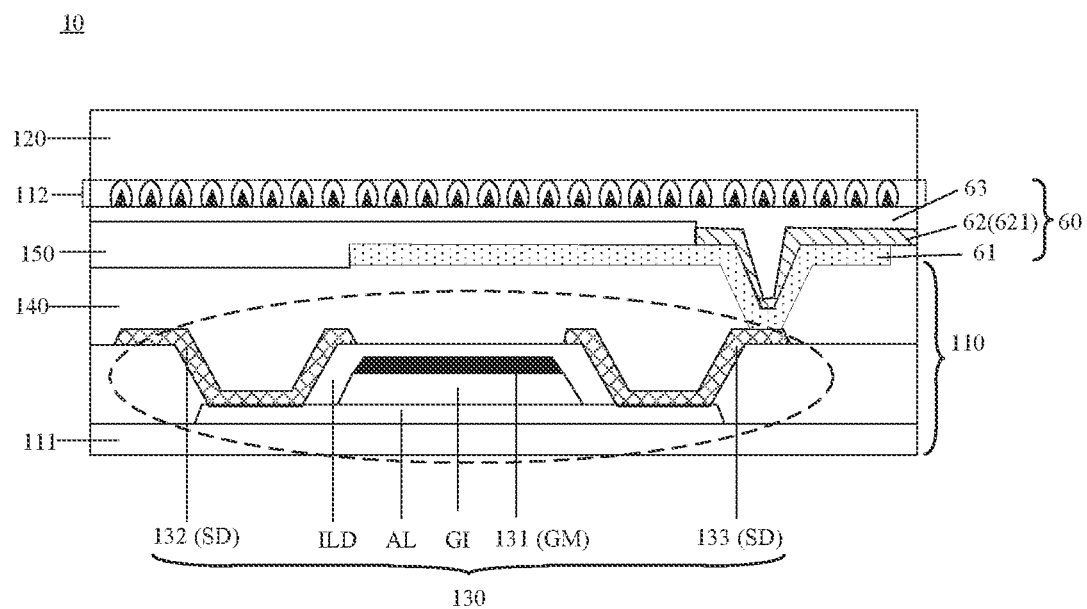
FIG. 3B is a structural diagram of another display panel, in accordance with some embodiments.
Figure 4:
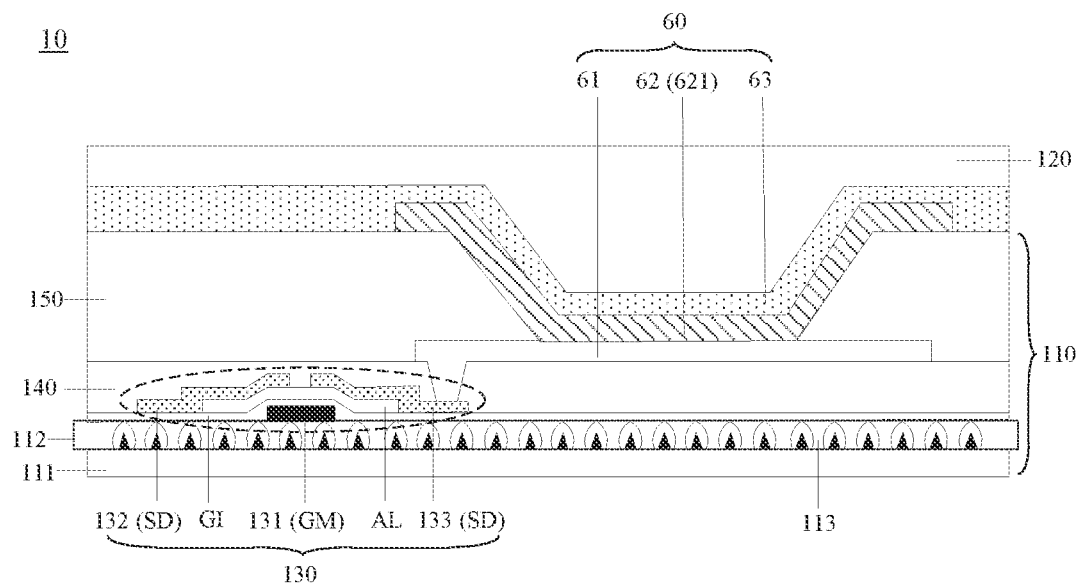
FIG. 4 is a structural diagram of still another display panel, in accordance with some embodiments.

Since respective structures of the sub-pixels P in the display panel 10 are substantially repetitive, in FIGS. 3A, 3B and 4, an internal structure of the display panel 10 is illustrated by taking a partial structure of a sub-pixel P shown in FIG. 2 as an example.

As shown in FIGS. 3A, 3B and 4, the display panel 10 includes an array substrate 110 having a plurality of stacked pattern layers, the light-emitting devices 60 and an encapsulation layer 120. The encapsulation layer 120 is used to prevent moisture and oxygen from entering the array substrate 110 and the light-emitting devices 60, thereby as avoiding a problem of poor display. The display panel 10 further includes a grating 112 disposed on a light-emitting side of the display panel 10. As a type of the light-emitting device 60 varies, the specific position of the grating 112 is different, which will be detailed later. By providing a grating 112 in the display panel 10, it may be possible to use the diffraction of the grating 112 to reduce light output loss of the display device 100, and thus improve a light output efficiency of the display device 100.

The array substrate 110 includes a substrate 111 and pixel circuits 50 disposed on the substrate 111. The substrate 111 may be a flexible base substrate or a rigid base substrate. A constituent material of the flexible substrate 111 may be one or more of polyimide (PI), polyethylene terephthalate (PET) and polyethylene naphthalate two formic acid glycol ester (PEN), etc. A constituent material of the rigid substrate 111 may be, for example, glass.

The array substrate 110 further includes gate lines GL arranged in one direction on the substrate 111, data lines DL insulated and crossed with the gate lines GL, and common power lines generally parallel to the data lines DL. The plurality of sub-pixels P (as shown in FIG. 2) may be defined by the gate lines GL and the data lines DL (and the common power lines) that are arranged to cross each another. The pixel circuits 50 are electrically connected to the gate driving circuits 70 through the gate lines GL, so as to receive gate-driving signals transmitted from the gate driving circuits 70. The pixel circuits 50 are further electrically connected to the source driving circuit 80 through the data lines DL, so as to receive data signals transmitted from the source driving circuit 80.

The pixel circuit 50 includes at least one thin film transistor (TFT) 130 and at least one capacitor (not shown in FIGS. 3A, 3B and 4). Each thin film transistor 130 may adopt a top-gate structure or a bottom-gate structure. As shown in FIGS. 3A and 3B, in a case where the thin film transistor 130 has a top-gate structure, the thin film transistor 130 includes an active layer AL, a gate insulation layer GI, a gate metal pattern layer GM (used for forming a gate 131), a interlayer dielectric layer ILD, and a source-drain metal pattern layer SD (used for forming a source 132 and a drain 133), which are disposed on the substrate 111. In some other embodiments, as shown in FIG. 4, in a case where the thin film transistor 130 has a bottom-gate structure, the thin film transistor 130 includes a gate metal pattern layer GM (used for forming the gate 131), a gate insulation layer GI, an active layer AL, and a source-drain metal pattern layer SD (used for forming a source 132 and a drain 133).

The thin film transistor 130 may be of various types. For example, it may be an N-type thin film transistor or a P-type thin film transistor, the difference between which only lies in conduction conditions. The N-type thin film transistor is turned on under control of a high level, and is turned off under control of a low level. On the contrary, the P-type thin film transistor is turned on under control of a low level, and is turned off under control of a high level. The active layer AL of the thin film transistor 130 may be composed of amorphous silicon, single crystal silicon, polycrystalline silicon, or an oxide semiconductor. The active layer AL includes a channel region that is not doped with impurities, and a source region and a drain region that are located on both sides of the channel region and formed by doping impurities. The doped impurities vary as the type of the thin film transistor 130 changes, and may be N-type impurities or P-type impurities.

The capacitor includes a first electrode plate and a second electrode plate, and an interlayer insulating film as a dielectric is provided between the two electrode plates.

Figure 5:
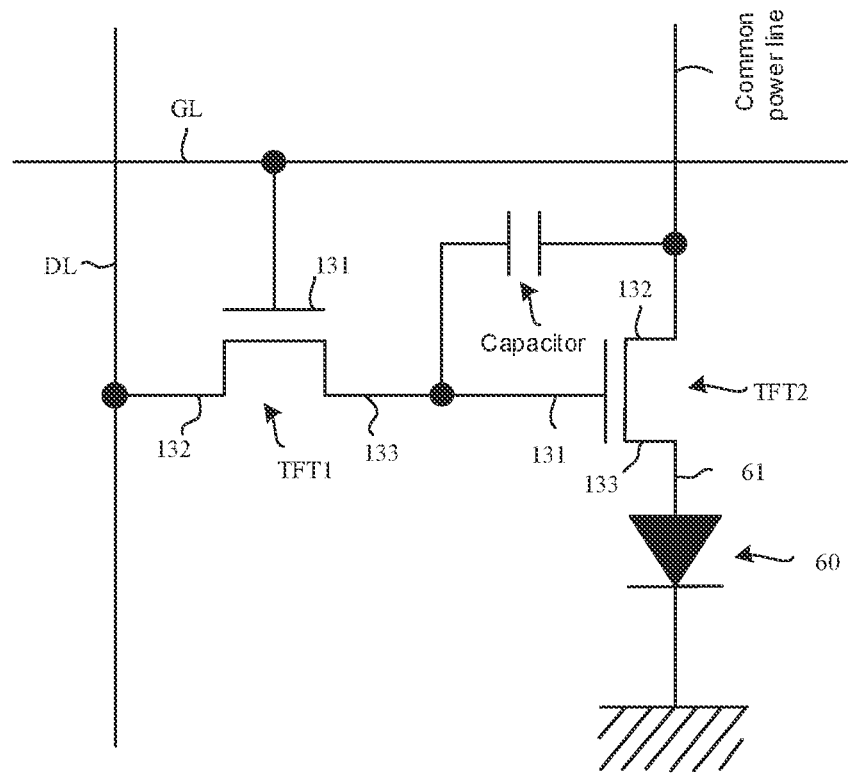
FIG. 5 is an equivalent circuit diagram of a pixel circuit, in accordance with some embodiments.

In FIG. 5, an electrical connection between the inside and outside of the pixel circuit is illustrated by taking a 2T1C structure, in which the pixel circuit 50 includes two thin film transistors 130 (i.e., a switching thin film transistor TFT1 and a driving thin film transistor TFT2) and one capacitor, as an example. Although FIGS. 3A, 3B and 4 only show a structure and connection relationship of the driving thin film transistor (as shown in dashed circles in FIGS. 3A, 3B and 4) and the light-emitting device 60, a person of ordinary skill in the art may completely determine a structure of a switching transistor and its connection with other components according to the description of the context.

As shown in FIG. 5, a gate 131 of the switching thin film transistor TFT1 is connected to a gate line GL, a source 132 of the switching thin film transistor TFT1 is connected to a data line DL, and a drain 133 of the switching thin film transistor TFT1 is connected to a gate 131 of the driving thin film transistor TFT2. A source 132 of the driving thin film transistor TFT2 is connected to a common power line, and a drain 133 of the driving thin film transistor TFT2 is connected to a first electrode 61 of the light-emitting device 60 through a via hole. The first electrode plate of the capacitor is connected to the gate 131 of the driving thin film transistor TFT2, and the second electrode plate of the capacitor is connected to the source 132 of the driving thin film transistor TFT2.

The switching thin film transistor TFT1 is turned on by a gate voltage applied to the gate line GL, thereby transmitting a data voltage applied to the data line DL to the driving thin film transistor TFT2. There is a certain difference between the data voltage transmitted from the switching thin film transistor TFT1 to the driving thin film transistor TFT2 and a common voltage applied from the common power line to the driving thin film transistor TFT2. A voltage equivalent to an absolute value of the difference is stored in the capacitor, and a current corresponding to the voltage stored in the capacitor flows into the light-emitting device 60 through the driving thin film transistor TFT2, thereby causing the light-emitting device 60 to emit light.

In addition, as shown in FIGS. 3A, 3B and 4, the light-emitting device 60 includes a first electrode 61, a light-emitting functional layer 62, and a second electrode 63, which are disposed on the array substrate 110 in sequence. One of the first electrode 61 and the second electrode 63 is as an anode (used to provide holes), and the other is as a cathode (used to provide electrons). The first electrode 61 and the second electrode 63 inject holes and electrons into the light-emitting functional layer 62. When excitons generated from the combination of holes and electrons transition from an excited state to a ground state, light will be emitted.

In some embodiments, the first electrode 61 may be made of a transparent conductive film, and the second electrode 63 may be made of a metal with high reflectivity. In this case, light of the light-emitting functional layer 62 is reflected by the second electrode 63, and then exits through the first electrode 61, thereby forming a bottom-emission-type light-emitting device. As shown in FIGS. 3A and 4, in a case where the light-emitting device 60 is a bottom-emission-type light-emitting device, the grating 112 is disposed between the substrate 111 and the thin film transistor 130. By using the grating 112 to diffract the outgoing light, it may be possible to reduce waveguide loss of the outgoing light caused by the substrate 111, increase a light extraction rate, and thus improve a light extraction efficiency of the display device 100.

In some other embodiments, the first electrode 61 may be made of a metal with high reflectivity, and the second electrode 63 may be made of a transparent conductive film. In this case, light of the light-emitting functional layer 62 is reflected by the first electrode 61, and exits through the second electrode 63, thereby forming a top-emission-type light-emitting device. As shown in FIG. 3B, in a case where the light-emitting device 60 is a top-emission-type light-emitting device, the grating 112 is disposed between the encapsulation layer 120 and the second electrode 63. By using the grating 112 to diffract the outgoing light, it may be possible to reduce waveguide loss of the outgoing light caused by the encapsulation layer 120, increase the light extraction rate, and thus improve the light extraction efficiency of the display device 100.

The transparent conductive film may be made of, for example, indium tin oxide (ITO), indium zinc oxide (IZO), indium gallium zinc oxide (IGZO), or other metal oxides. The metal with high reflectivity may be, for example, magnesium aluminum alloy (MgAl), lithium aluminum alloy (LiAl) and other alloys, or magnesium (Mg), aluminum (Al), lithium (Li), silver (Ag), and other metallic elements. In addition, these metal materials further have high conductivity, low work function, and other characteristics.

Unless otherwise specified, the following description is made by taking the bottom-emission-type light-emitting device 60 shown in FIGS. 3A and 4 as an example. In this case, light emitted by the display panel 10 exits from the substrate 111 in a direction moving away from the grating 112. Both the substrate 111 and the grating 112 are made of transparent materials in order to make the light exit smoothly. In some embodiments of the present disclosure, light transmittances of the transparent substrate 111 and the transparent grating 112 may exceed 85%.

In some embodiments, the light-emitting functional layer 62 includes a light-emitting layer 621. In some other embodiments, the light-emitting functional layer 62 further includes at least one of a hole injection layer (HIL), a hole transporting layer (HTL), an electron transporting layer (ETL) and an electron injection layer (EIL) in addition to the light-emitting layer 621. In a case where the light-emitting functional layer 62 includes all the above layers, the hole injection layer, the hole transporting layer, the light-emitting layer 621, the electron transporting layer and the electron injection layer are sequentially stacked on the first electrode 61, which is used as an anode.

As shown in FIGS. 3A and 4, the array substrate 110 may further include a planarization layer 140 disposed between the thin film transistor 130 and the first electrode 61, and a pixel defining layer 150 disposed on a side of the planarization layer 140 away from the substrate 111. The pixel defining layer 150 includes a plurality of opening regions and barrier walls arranged around the opening regions. One light-emitting device 60 is disposed in one opening region, and the first electrodes 61 and the light-emitting layers 621 of adjacent light-emitting devices 60 are separated by the barrier walls of the pixel defining layer 150. The second electrodes 63 of the light-emitting devices 60 are connected together. That is, the second electrodes 63 form a one-piece whole layer. The hole injection layers, hole transporting layers, electron transporting layers and electron injection layers in the light-emitting functional layers 62 may be separated by the barrier walls of the pixel defining layer 150, or may form a one-piece whole layer. The pixel defining layer 150 may be made of, for example, black polyimide, which may be able to absorb light emitted by one light-emitting device 60 and directed to an adjacent light-emitting device 60 and thus prevent light mixing between two adjacent sub-pixels.

The encapsulation layer 120 may be an encapsulation film. The number of layers of the encapsulation film is not limited. In some embodiments, the encapsulation layer 120 may include one layer of encapsulation film, or may include two or more layers of encapsulation films that are stacked. For example, the encapsulation layer 120 includes three layers of encapsulation films that are stacked in sequence.

In a case where the encapsulation layer 120 includes three layers of encapsulation films that are stacked in sequence, an encapsulation film located in a middle layer is made of an organic material, and encapsulation films located on two sides are made of an inorganic material. Herein, the organic material may be, for example, polymethyl methacrylate (PMMA), and the inorganic material may be one or more of silicon nitride ($SiN_x$), silicon oxide ($SiO_x$) or silicon oxynitride ($SiO_xN_y$).

Some embodiments of the present disclosure further provide a grating 112, which is disposed between the substrate 111 and the thin film transistor 130 (as shown in FIGS. 3A and 4). By providing the grating, it may be possible to reduce waveguide mode loss on the substrate 111, increase the light extraction rate, and thus improve the light extraction efficiency of the display device 100.

Figure 6:
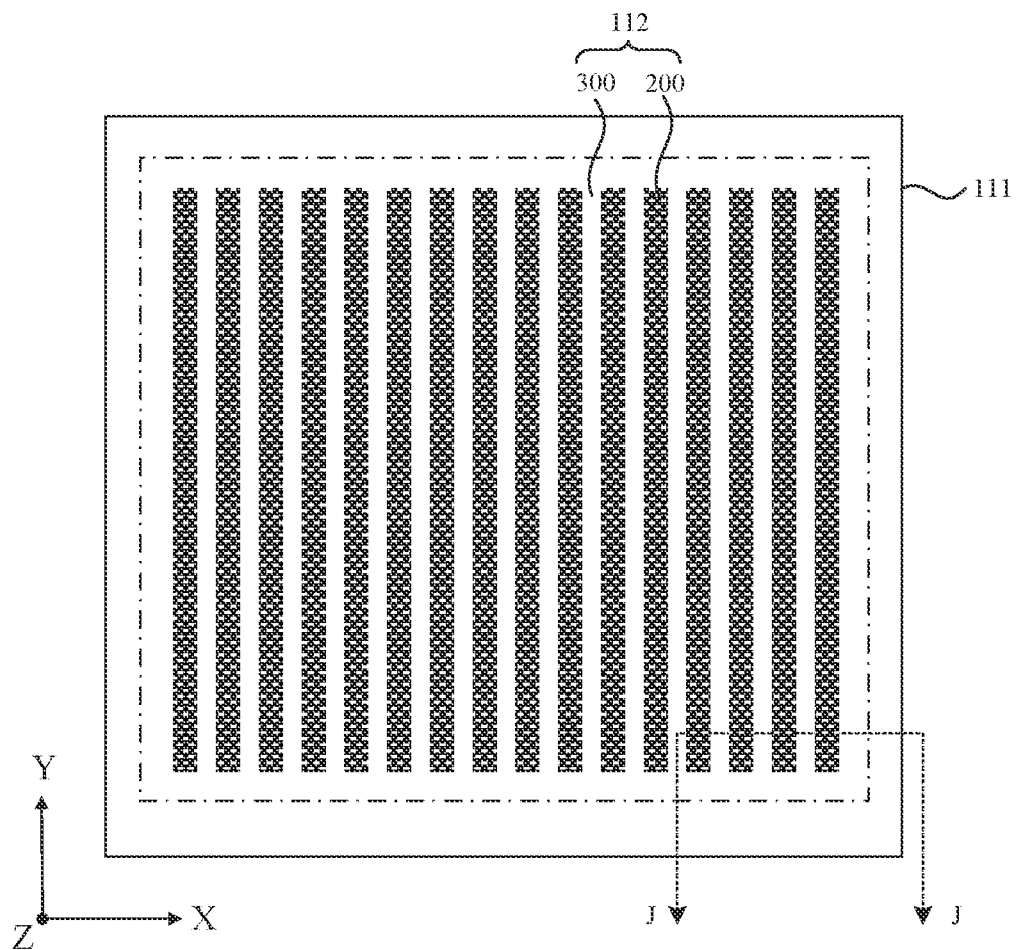
FIG. 6 is a plan view of a grating, in accordance with some embodiments.

As shown in FIG. 6, the grating 112 includes a plurality of protruding portions 200 and interval portions 300 located between adjacent protruding portions 200. FIG. 6 illustrates an example where the protruding portions 200 are identical and the interval portions 300 are identical, but the present disclosure is not limited thereto.

Figure 7:
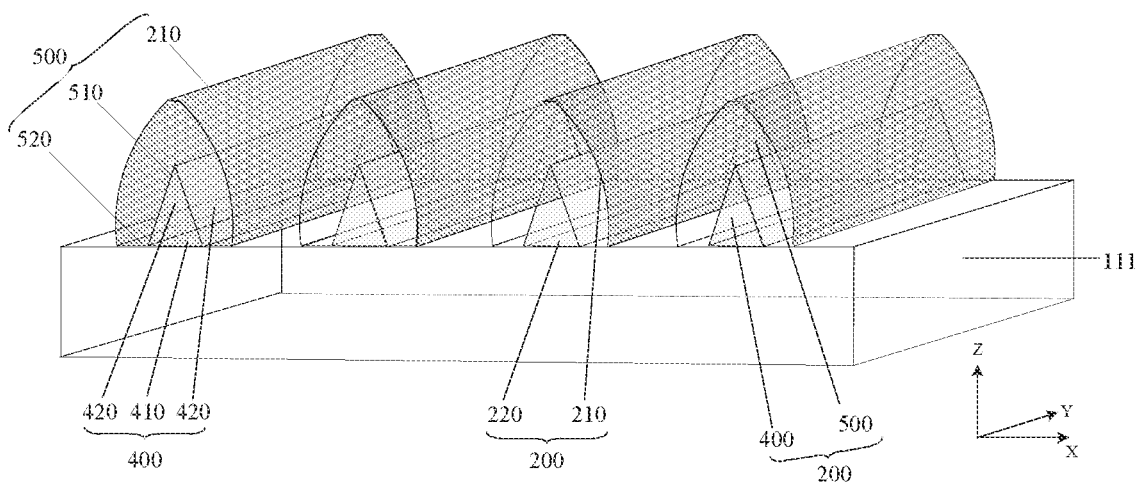
FIG. 7 is a three-dimensional structural diagram of part of a grating, in accordance with some embodiments.

FIG. 7 is a three-dimensional diagram of a partial structure of the grating 112 shown in FIG. 6. As shown in FIG. 7, each protruding portion 200 of the grating 112 includes an outer surface 210 and a bottom surface 220. The outer surface 210 is a smooth curved surface, and the bottom surface 220 is a flat surface. The plurality of protruding portions 200 are arranged on the substrate 111 along a first direction, and each protruding portion 200 extends along a second direction perpendicular to the first direction. For example, the first direction is an X direction shown in FIG. 6 or FIG. 7, and the second direction is a Y direction shown in FIG. 6 or FIG. 7.

Figure 8:
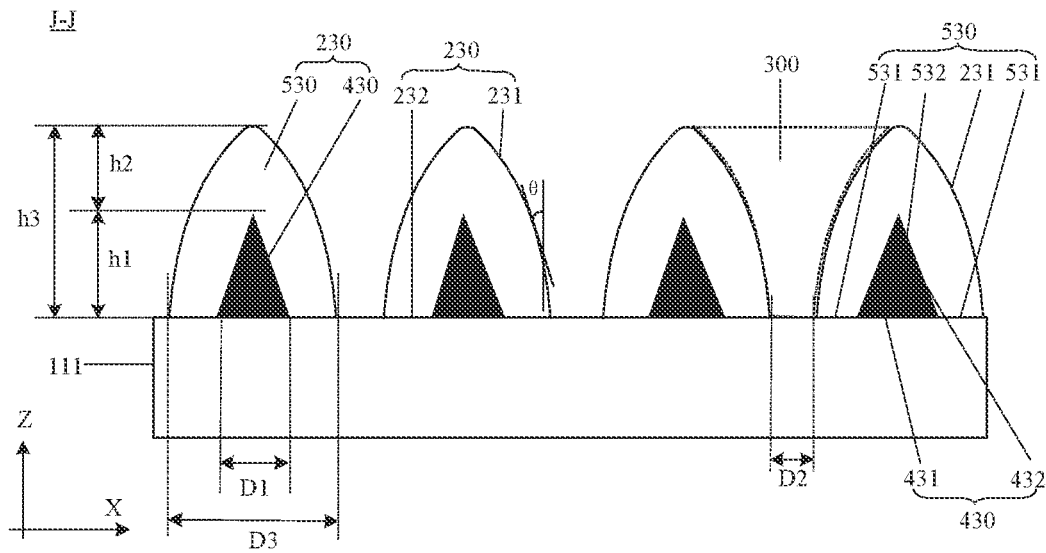
FIG. 8 is a cross-sectional view of the grating and substrate shown in FIG. 6 taken along line J-J.

FIG. 8 is a cross-sectional view of the grating 112 shown in FIG. 6 taken along line J-J, and further illustrates a structure of the grating 112. As shown in FIG. 8, a cross-sectional figure of each protruding portion 200 along the line J-J is a first figure 230, which includes a curve 231 and a bottom edge 232. The curve 231 is cross-sectional figure of the outer surface 210 along the Line J-J shown in FIG. 7, and is a smooth curve. The bottom edge 232 is a cross-sectional figure of the bottom surface 220 along the Line J-J shown in FIG. 7, and is a closed figure of an arched shape.

As shown in FIG. 8, an included angle θ between a tangent to any point on the curve 231 and a straight line along a Z direction is greater than or equal to 5° and less than 90° (that is, $5°≤θ<90°$). The included angle θ is an included angle that opens upward and faces away from the substrate 111, or is an included angle that opens downward and faces the substrate 111. In a case where an angle θ between a tangent to any point on a side of the curve 231 proximate to the substrate 111 and a straight line along the Z direction is less than 5°, and an angle θ between a tangent to any point on a side of the curve 231 away from the substrate 111 and a straight line along the Z direction is close to 90°, the first figure 230 is a shaped like a rectangle, and the protruding portion 200 is shaped like a cube or a cuboid. In this case, an area of a side of the protruding portion 200 away from the substrate 111 (also called a top of the protruding portion 200) is relatively large. As a result, it is easy for a subsequent layer (such as a buffer layer 113 in FIGS. 3A and 4) to be deposited on the top of the protruding portion 200 first during a deposition process. Consequently, an upper portion of the interval portion 300 (away from the substrate 111) may be blocked, and there might be a cavity at a bottom portion (proximate to the substrate 111), thereby causing the subsequent film layer to be unevenly deposited and affecting a light-emitting performance of the light-emitting device 60. By limiting the included angle in the above range, the subsequent film layer may be smoothly deposited to the bottom portion of the interval portion 300, and it may be possible to preventing the upper portion of the interval region 300 from being blocked and prevent a cavity from being formed at the bottom portion of the interval region 300. It will be noted that, in a case where the light-emitting device 60 is a top-emission-type light-emitting device, the subsequent film layer is the encapsulation layer 120 shown in FIG. 3B.

As shown in FIG. 7, each protruding portion 200 further includes a first protruding portion 400 and a second protruding portion 500, which are located on a same side of the substrate 111 and are in contact with the substrate 111. An orthographic projection of the first protruding portion 400 on the substrate 111 is located within an orthographic projection of the second protruding portion 500 of the substrate 111. A plurality of first protruding portions 400 constitute a first pattern layer of the grating 112, and a plurality of second protruding portion 500 constitute a second pattern layer of the grating 112.

The purpose for dividing the grating 112 into two parts, i.e. the first pattern layer and the second pattern layer located on the first pattern layer, is to use existing process and equipment to fabricate the grating having the above structure, so as to reduce production cost (this will be pointed out in the following description of manufacturing method of the grating 112).

As shown in FIG. 7, the first protruding portion 400 includes a first bottom surface 410, and two side surfaces 420 that are opposite to each other. The second protruding portion 500 includes the outer surface 210 away from the first protruding portion 400, an inner surface 510 proximate to the first protruding portion 400, and a second bottom surface 520. The inner surface 510 is in contact with and covers the two side surfaces 420 of the first protruding portion 400.

It will be noted that, the first bottom surface 410 of the first protruding portion 400 and the second bottom surface 520 of the second protruding portion 500 together form the bottom surface 220 of the protruding portion 200, and the first bottom surface 410 and the second bottom surface 520 are located in a same plane.

As shown in FIG. 8, a cross-sectional figure of the first protruding portion 400 along the line J-J is a second figure 430. The second figure 430 is a triangle including a first bottom edge 431 and two side edges 432. The first bottom edge 431 is a cross-sectional figure of the first bottom surface 410 along the line J-J, and the side edges 432 are cross-sectional figures of the side surfaces 420 along the line J-J. A cross-sectional figure of the second protruding portion 500 along the line J-J is a third figure 530. The third figure 530 includes the curve 231, a second bottom edge 531 and an inner edge 532. The second bottom edge 531 is a cross-sectional figure of the second bottom surface 520 along the line J-J, and the inner edge 532 is a cross-sectional figure of the inner surface 510 along the line J-J.

It will be noted that, the bottom edge 232 of the first figure 230 includes the first bottom edge 431 and the second bottom edge 531, and is in contact with the substrate 111.

By providing the second protruding portion 500 with the outer surface 210 (smooth curved surface) in the grating 112, the first protruding portion 400 having the triangular structure is smoothed. In this way, it may be possible to prevent a situation in which a large amount of charge accumulates at a tip formed at a position of the first protruding portion 400 corresponding to the first electrode 61 when the light-emitting device 60 is being directly formed on the first protruding portion 400 having the triangular structure, causes a short circuit between the first electrode 61 and the second electrode 63, and causes the light-emitting device 60 to fail. In addition, by providing the grating 112 with the arched structure in the display panel 10, it may be possible to extract photons confined by the waveguide effect of the substrate 111 through diffraction of the grating 112, and thus increase a photon utilization rate and improve the light extraction efficiency of the display device 100.

It will be noted that, bottom edges 232 of a plurality of first figures 230 are located on a same straight line. However, considering process error, the bottom edges 232 of the plurality of first patterns 230 may be displaced relative to each other in the Z direction as shown in FIG. 8. Therefore, the bottom edges 232 of the plurality of first figures 230 may be substantially located on the same straight line.

Embodiments of the present disclosure do not limit a fabrication process of the first protruding portion 400. For example, the first protruding portion 400 may be fabricated by a photolithography process. A typical photolithography process refers to a process that uses a mask and in which a surface of a film is coated with a photoresist, the photoresist is exposed and developed, areas of the film exposed by the photoresist is etched to form a specific pattern, and then the photoresist is removed so that the remaining film material forms a desired pattern. Embodiments of the present disclosure do not limit a fabrication process of the second protruding portion 500 either. For example, the second protruding portion 500 may be fabricated by a chemical vapor deposition (CVD) process. The process of using CVD equipment to fabricate the second protruding portion 500 is very simple with high industrial production efficiency.

As shown in FIG. 8, a width of each protruding portion 200 is a length D3 of an orthographic projection of the first figure 230 on the substrate 111 along the X direction. A minimum width of each interval portion 300 is a minimum distance D2 between two adjacent protruding portions 200. A width of each first protruding portion 400 is a length D1 of an orthographic projection of the second figure 430 on the substrate 111 along the X direction. A maximum thickness of the protruding portion 200 in the Z direction is a maximum thickness h3 of the first figure 230 in the Z direction. A maximum thickness of the first protruding portion 400 in the Z direction is a maximum thickness h1 of the second figure 430 in the Z direction. A thickness of the second protruding portion 500 deposited on the top of the first protruding portion 400 is a thickness h2 (h3−h1) shown in FIG. 8. A width of the second protruding portion 500 deposited on the side surfaces 420 of the first protruding portion 400 is (D3−D1) as shown in FIG. 8.

In some embodiments, a ratio of the thickness h3 of the protruding portion 200 to the width D3 thereof is greater than or equal to 1 and less than or equal to 5 (that is, 1≤h3/D3≤5). In a case where the ratio h3/D3 meets the above requirement, more additional surface wave vectors may be obtained through the diffraction of the grating 112, and photons confined by the waveguide effect of the substrate 111 may be extracted as much as possible, thereby improving an external quantum efficiency (EQE) of the display device 100. For example, the ratio h3/D3 may be 1.5, 2, 2.5, 3, 3.5, 4 or 4.5.

During the process of depositing a film layer on the first protruding portion 400 by CVD technology to form the second protruding portion 500, the deposition efficiency is higher at the top of the first protruding portion 400 than at the side surfaces 420, For example, in a case where a thickness of the deposited film is W, the thickness h2 of the second protruding portion 500 finally deposited on the top of the first protruding portion 400 is greater than or equal to ½W and less than or equal to W (that is, ½W≤h2≤W), and the width (D3−D1) of the second protruding portion 500 finally deposited on the side surfaces 420 of the first protruding portion 400 is greater than or equal to ⅓W and less than or equal to ⅔W (that is, ⅓W≤D3−D1≤⅔W).

In practical applications, an approximate range of the thickness h1 and the width D1 of the first protruding 400 may be determined according to the ratio of the thickness h3 of the protruding portion 200 to the width D3 thereof, specific values of the thickness h3 or the width D3 of the protruding portion 200, and the thickness W of the deposited film layer used for forming the second protruding portion 500, which are regarded as target values. For example, the ratio of the thickness h3 of the protruding portion 200 to the width D3 thereof is set to 1.5; the width D3 of the protruding portion 200 is set to 90 nm, and the thickness of the deposited film layer is set to 60 nm. In this case, the thickness h3 of the protruding portion 200 is 135 nm; the thickness h2 of the second protruding portion 500 finally deposited on the top of the first protruding portion 400 is in a range of 30-60 nm, and the width (D3−D1) of the second protruding portion 500 finally deposited on the side surfaces 420 of the first protruding portion 400 is in a range of 20-40 nm. In this way, it may be deduced that, a design range of the thickness h1 of the first protruding portion 400 is 75-105 nm, and a design range of the width D1 is 50-70 nm.

It can be seen that, the ratio h1/D1 of the thickness h1 of the first protruding portion 400 to the width D1 thereof is also 1.5, which is the same as the ratio of the thickness h3 of the protruding portion 200 to the width D3 thereof. It can be seen from the above that, in a case where the ratio of the thickness h3 of the protruding portion 200 to the width D3 thereof, as a target value, is determined, the ratio of the thickness h1 of the first protruding portion 400 to the width D1 thereof is also determined, and the two ratios are equal. Therefore, during a process of fabricating the grating 112, a size ratio of the protruding portion 200 (e.g. the ratio of the thickness h3 to the width D3) may be used to determine a size ratio of the first protruding portion 400 (e.g. the ratio of the thickness h1 and the width D1) during the fabrication process.

It will be noted that, due to errors in the fabrication process, it is an ideal situation that the ratio of the thickness h1 of the first protruding portion 400 to the width D1 thereof is equal to the ratio of the thickness h3 of the protruding portion 200 to the width D3 thereof. In practical applications, the ratio of the thickness h1 of the first protruding portion 400 to the width D1 thereof only needs to be approximately equal to the ratio of the thickness h3 of the protruding portion 200 to the width D3 thereof.

A refractive index of the first protruding portion 400 is less than a refractive index of the second protruding portion 500. With this design, it may be possible to further reduce the waveguide mode loss on the substrate 111, further increase the light extraction rate, and further improve the external quantum efficiency EQE of the display device 100.

Embodiments of the present disclosure do not limit materials of the first protruding portion 400 and the second protruding portion 500, as long as it is ensured that the refractive index of the first protruding portion 400 is less than that of the second protruding portion 500. For example, a constituent material of the first protruding portion 400 may be silicon oxide ($SiO_x$), and a constituent material of the second protruding portion 500 may be at least one of silicon nitride ($Si_3N_4$), titanium dioxide ($TiO_2$), or aluminum oxide ($Al_2O_3$). For example, in a case where the constituent material of the first protruding portion 400 is $SiO_x$ and the constituent material of the second protruding portion 500 is $Si_3N_4$, since a refractive index of $SiO_x$ is 1.2 and a refractive index of $Si_3N_4$ is 2, the protruding portion 200 has a structure of combining high and low refractive indexes. In addition, both $SiO_x$ and $Si_3N_4$ may form a transparent film layer, which will not block light from exiting. Therefore, by selecting $SiO_x$ as the constituent material of the first protruding portion 400 and $Si_3N_4$ as the constituent material of the second protruding portion 500, not only the waveguide mode loss on the substrate 111 may be reduced and the light extraction rate may be increased, but also the outgoing light may not be blocked.

Figure 9:
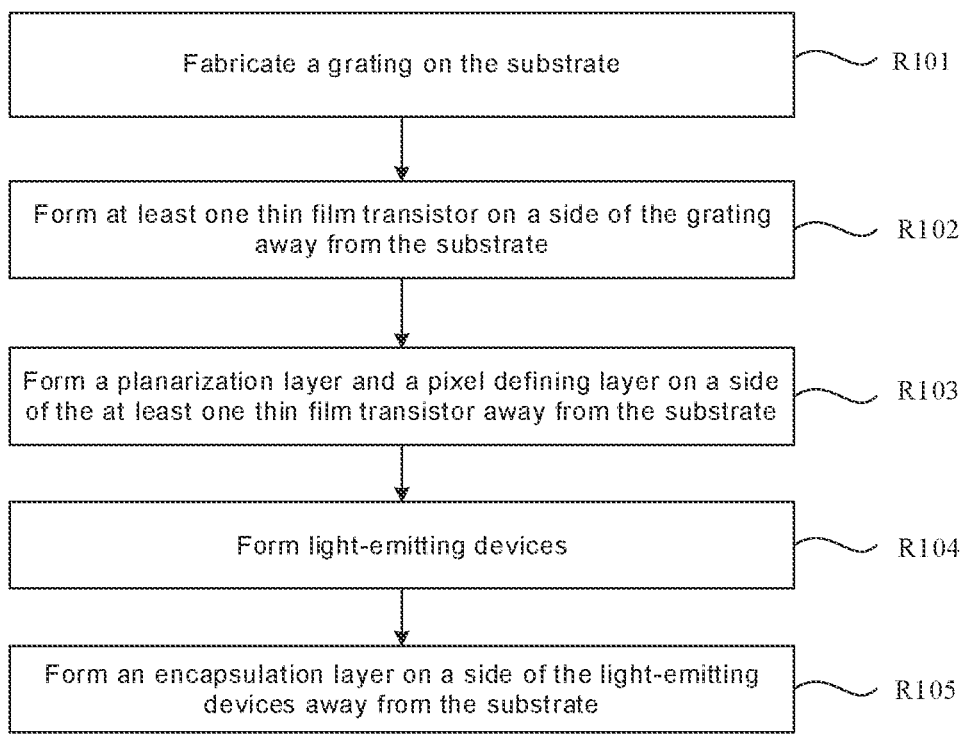
FIG. 9 is a flow diagram of a method for manufacturing a display panel, in accordance with some embodiments.

Based on the same inventive concept, referring to FIG. 9, some embodiments of the present disclosure further provide a method for manufacturing the display panel 10. In a case where the display panel 10 is the display panel 10 as shown in FIG. 3A or FIG. 4, the method includes the following steps R101 to R105.

In R101, a grating 112 is fabricated on the substrate 111.

Embodiments of the present disclosure do not limit a constituent material of the substrate 111, as long as it is ensured that the substrate 111 is a transparent substrate. In some examples, the substrate 111 may be a rigid substrate made of, for example, transparent glass. The substrate 111 may also be a flexible substrate made of, for example, one or more of polyimide (PI), polyethylene terephthalate (PET), and polyethylene naphthalate two formic acid glycol ester (PEN), etc.

Figure 10:
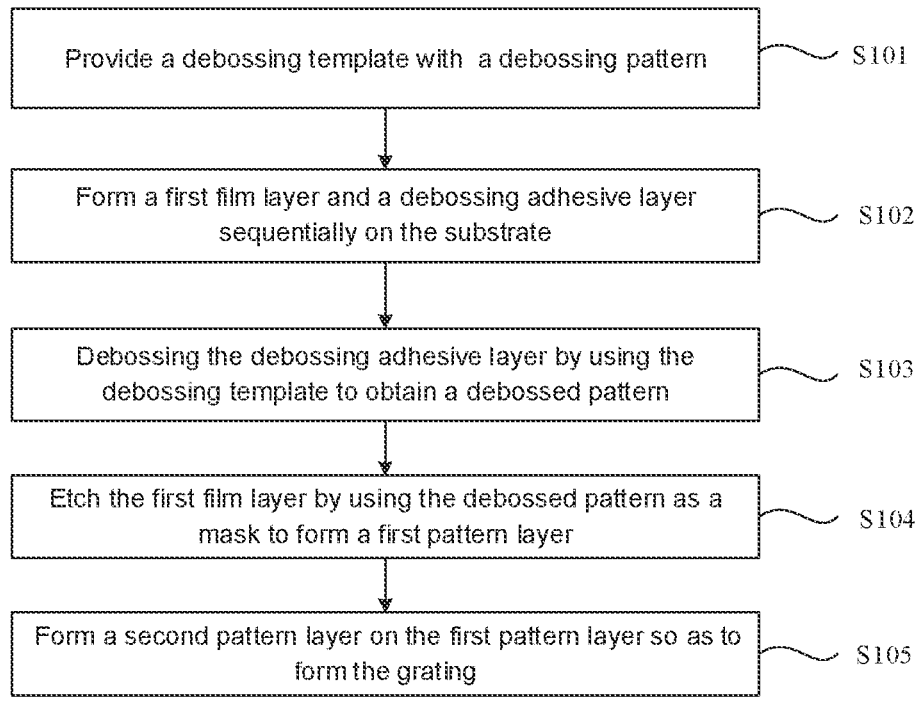
FIG. 10 is a flow diagram of a method for manufacturing a grating, in accordance with some embodiments.

A method for fabricating the grating 112 includes steps S101 to S105 as shown in FIG. 10.

Figure 11:
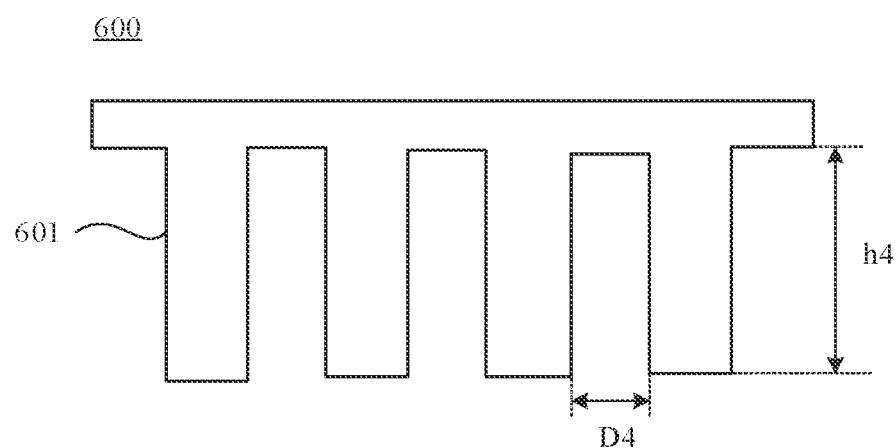
FIG. 11 is a structural diagram of a debossing template, in accordance with some embodiments.

In S101, a debossing template 600 with a debossing pattern is provided. For example, as shown in FIG. 11, the debossing template 600 is a comb-shaped debossing template. The debossing template 600 includes a plurality of first rectangular portions 601. A height of each first rectangular portion 601 is h4, and a distance between any two adjacent first rectangular portions 601 is D4. For example, the height h4 of the first rectangular portion 601 is 100 nm, and the distance D4 between adjacent first rectangular portions 601 is 60 nm. However, the present disclosure is not limited thereto.

Figure 12:
FIGS. 12 to 15 are process diagrams of a method for manufacturing a grating, in accordance with some embodiments.

In S102, as shown in FIG. 12, a first film layer 610 and a debossing adhesive layer 620 are sequentially formed on the substrate 111.

Embodiments of the present disclosure do not limit a method for forming the first film layer 610 and the debossing adhesive layer 620, which may be determined according to materials of the first film layer 610 and the debossing adhesive layer 620. For example, a constituent material of the first film layer 610 is silicon oxide. In this case, the first film layer 610 may be formed by a CVD process, which is very simple and has high industrial production efficiency. A constituent material of the debossing adhesive layer 620 may be polymethyl methacrylate (PMMA). In this case, the debossing adhesive layer 620 may be obtained by a coating process, which is very simple and has low production cost. The following embodiments are described by taking an example where the first film layer 610 is made of silicon oxide and the debossing adhesive layer 620 is made of PMMA.

Embodiments of the present disclosure do not limit thicknesses of the first film layer 610 and the debossing adhesive layer 620. For example, a thickness h5 of the debossing adhesive layer 620 is 120 nm, and a thickness h6 of the first film layer 610 is 90 nm.

Figure 13:
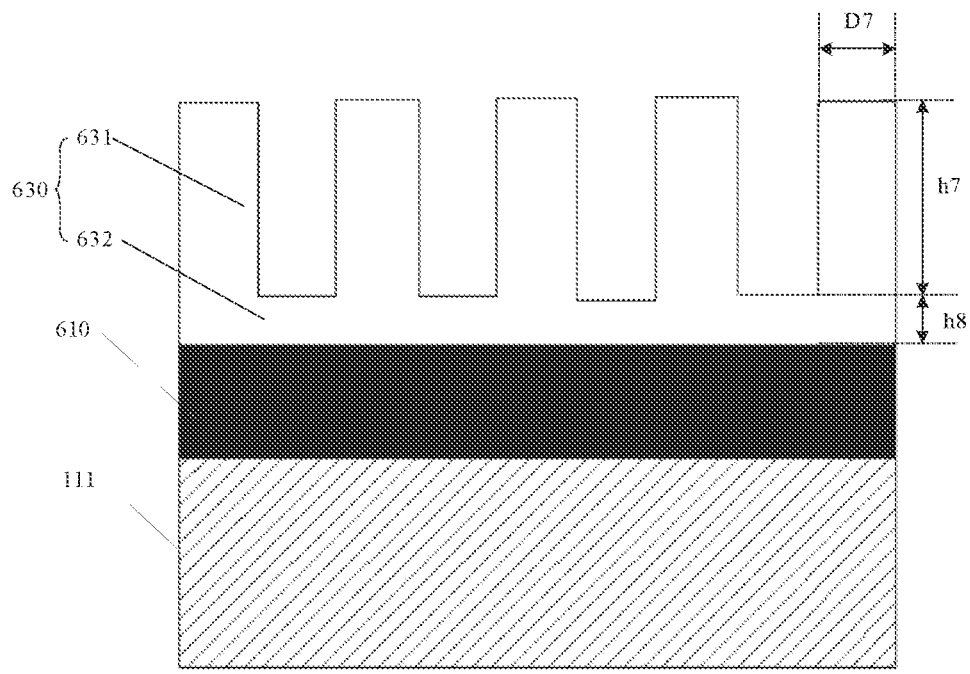

In S103, the debossing adhesive layer 620 is debossed by using the debossing template 600 to obtain a debossed pattern 630 as shown in FIG. 13.

For example, the pattern of the comb-shaped debossing template 600 shown in FIG. 11 may be transferred to the debossing adhesive layer 620 shown in FIG. 12 by a hot debossing method, so as to form the debossed pattern 630 shown in FIG. 13. After the debossed pattern 630 has been formed, a stress applied in the debossing process is removed, and the temperature is lowered to room temperature. The debossed pattern 630 includes a second rectangular portion 631 and a flat portion 632.

In a case where the height h4 of the first rectangular portion 601 is 100 nm, the distance D4 between adjacent first rectangular portions 601 is 60 nm, and the thickness h5 of the debossing adhesive layer 620 is 120 nm, a height h7 of the second rectangular portion 631 is 100 nm, a width D7 of the second rectangular portion 631 is 60 nm, and a thickness h8 of the flat portion 632 is 20 nm.

Figure 14:

In S104, the first film layer 610 is etched by using the debossed pattern 630 as a mask to form a first pattern layer 700 as shown in FIG. 14.

For example, as for the etching technique, a dry etching method may be adopted. The etching process is divided into a first etching stage and a second etching stage. In the first etching stage, oxygen is input to mainly etch portions of the flat portion 632 corresponding to intervals between the plurality of second rectangular portions 631, and the etching duration is about 15 to 20 seconds. It will be noted that, a gas input in the first etching stage is not limited to oxygen, and other gases that only etch the flat portion 632 but not the first film layer 610 (silicon oxide) may be selected. The etching duration of this stage may vary according to a speed of gas flow. For example, the greater the speed of gas flow, the shorter the etching duration.

In the second etching stage, hydrogen may be input, and remaining portions of the flat portion 632 and the first film layer 610 may be etched for about 50 to 60 seconds with hydrogen, so as to form the first pattern layer 700 as shown in FIG. 14. The first pattern layer 700 includes a plurality of first protruding portions 400. The gas input in the second etching stage is not limited to hydrogen, and other gases that can etch the flat portion 632 and the first film layer 610 may be selected. The etching duration at this stage may also vary according to the speed of gas flow. For example, the greater the speed of gas flow, the shorter the etching duration.

For example, in a case where the thickness h6 of the first film layer 610 is 90 nm, the height h1 of each first protruding portion 400 obtained by etching is also 90 nm. The width D1 of each first protruding portion 400 obtained by etching is approximately 60 nm.

Figure 15:
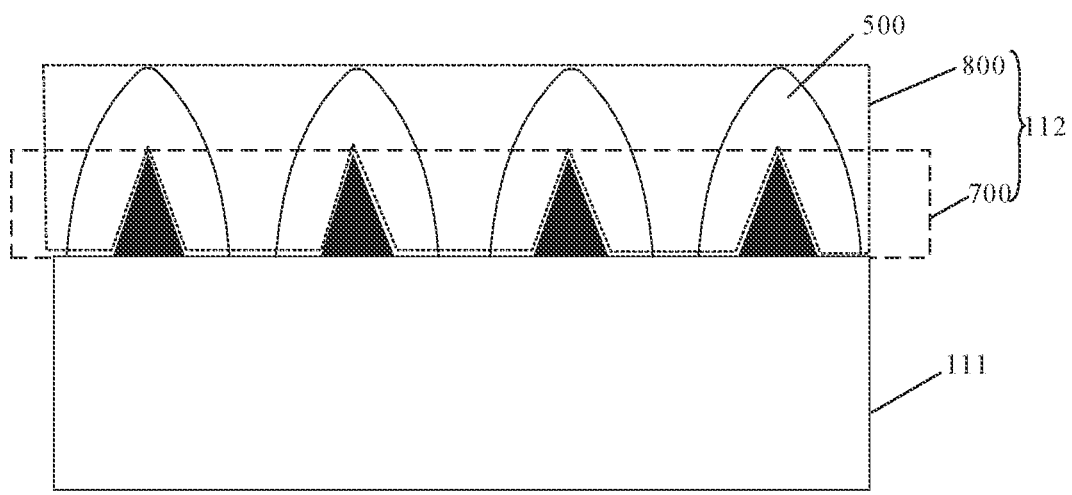

In S105, as shown in FIG. 15, a second pattern layer 800 is formed on the first pattern layer 700 so as to form the grating 112.

Embodiments of the present disclosure do not limit a constituent material or a method for fabricating the second pattern layer 800. For example, a constituent material of the second pattern layer 800 may be silicon nitride, and the silicon nitride layer may be fabricated by a CVD process, which is very simple and has high industrial production efficiency.

The second pattern layer 800 includes a plurality of the second protruding portions 500. As can be seen from the above, the thickness h2 of the second protruding portion 500 deposited on the top of the first protruding portion 400 is greater than or equal to ½W and less than or equal to W (that is, ½W≤h2≤W), and the width (D3−D1) of the second protruding portion 500 deposited on the side surfaces 420 of the first protruding portion 400 is greater than or equal to ⅓W and less than or equal to ⅔W (that is, ⅓W≤D3−D1≤⅔W, W being the thickness of the deposited film layer. For example, in a case where the thickness W of the deposited film layer used for forming the second pattern layer 800 is 60 nm, the thickness h2 of the second protruding portion 500 finally deposited on the top of the first protruding portion 400 is in a range of 30-60 nm (e.g., 45 nm), and the width (D3−D1) of the second protruding portion 500 finally deposited on the side surfaces 420 of the first protruding portion 400 is in a range of 20-40 nm (e.g., 30 nm). In this case, the width D3 of the protruding portion 200 is 90 nm, the height h3 of the protruding portion 200 is 135 nm, and the ratio of the height h3 to the width D3 of the protruding portion 200 is 1.5, which lies in the range of 1 to 2 (that is, 1≤h3/D3≤2). Through diffraction of the grating 112 having the protruding portions 200, it may be possible to obtain more additional surface wave vectors, and extract photons confined by the waveguide effect of the substrate 111 as much as possible, and thus improve the external quantum efficiency EQE of the display device 100.

It can be seen that, in the embodiments of the present disclosure, the first patterned layer 700 is formed by combining the rectangular debossing template 600 with other process steps, and the second patterned layer 800 is formed by depositing a film layer, so as to form a grating structure as shown in FIG. 15. This process is very simple with low production cost.

In R102, at least one thin film transistor 130 is formed on a side of the grating 112 away from the substrate 111.

As shown in FIG. 3 or 4, the thin film transistor 130 includes an active layer AL, a gate insulation layer GI, a gate metal pattern layer GM (used for forming the gate 131), an interlayer dielectric layer ILD, and a source-drain metal pattern layer SD (for forming the source 132 and the drain 133), which are disposed on the substrate 111.

In some embodiments, before fabricating the thin film transistor 130 on the side of the grating 112 away from the substrate 111, a buffer layer 113 may be fabricated on the side of the grating 112 away from the substrate 111 first, and then the thin film transistor 130 is fabricated on a side of the buffer layer 113 away from the substrate 111.

In R103, a planarization layer 140 and a pixel defining layer 150 are formed on a side of the at least one thin film transistor 130 away from the substrate 111.

Since constituent materials of the planarization layer 140 and the pixel defining layer 150 have been discussed above, details will not be repeated here. For example, the planarization layer 140 and the pixel defining layer 150 may be formed by a coating process.

In R104, light-emitting devices 60 are formed.

The light-emitting device 60 includes a first electrode 61, a light-emitting functional layer 62, and a second electrode 63, which are stacked in a direction moving away from the substrate 111. The first electrode 61 is made of a transparent conductive film, and the second electrode 63 is made of a metal with high reflectivity. The light-emitting functional layer 62 may only include the light-emitting layer 621, or may include at least one of a hole injection layer (HIL), a hole transporting layer (HTL), an electron transporting layer (ETL) and an electron injection layer (EIL) in addition to the light-emitting layer 621. Any layer of the light-emitting functional layer 62 may be obtained by a vapor deposition process, but it is not limited thereto.

In R105, an encapsulation layer 120 is formed on a side of the light-emitting layer 60 away from the substrate 111.

The structure of the encapsulation layer 120 has been discussed above. For example, in a case where the encapsulation layer 120 includes three layers of encapsulation films, an encapsulation film located in a middle layer is made of an organic material, and encapsulation films located on the two sides are made of an inorganic material. The organic material may be obtained by an ink jet printing (IJP) process, and the inorganic material may be obtained by a CVD process.

Figure 16:
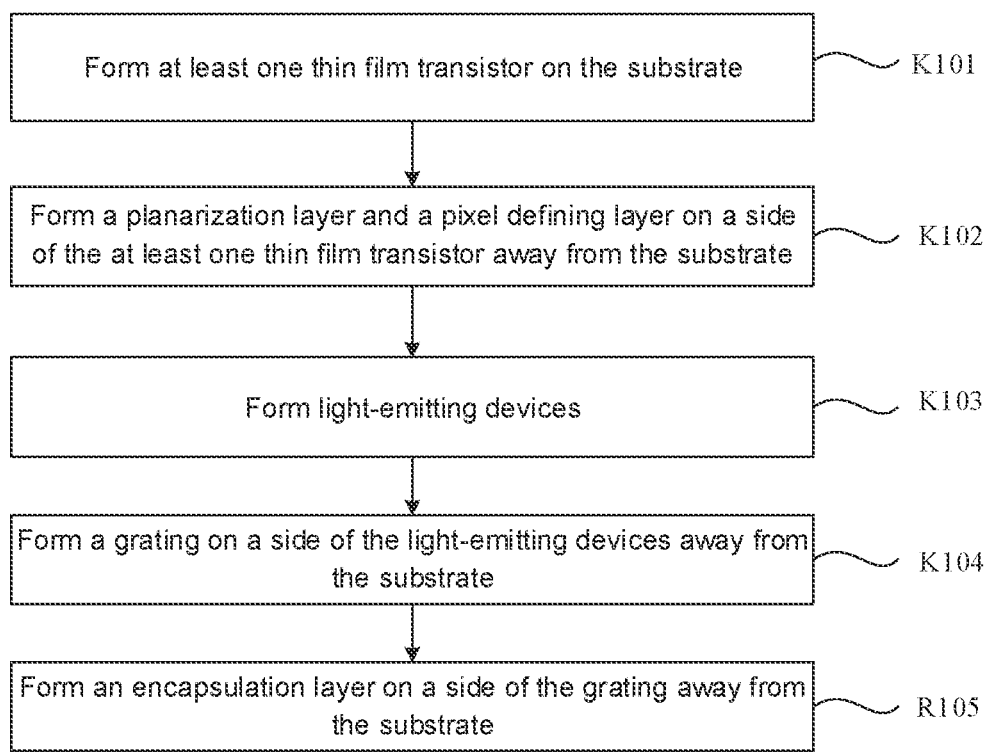
FIG. 16 is a flow diagram of another method for manufacturing a display panel, in accordance with some embodiments.

In some other embodiments of the present disclosure, in a case where the display panel 10 is the display panel shown in FIG. 3B, the method for manufacturing the display panel includes steps K101-105 as shown in FIG. 16.

In K101, at least one thin film transistor 130 is formed on the substrate 111. The description of a method of forming the thin film transistor 130 is similar to relevant description above, and details will not be repeated here.

In K102, a planarization layer 140 and a pixel defining layer 150 are formed on a side of the at least one thin film transistor 130 away from the substrate 111.

In K103, light-emitting devices 60 are formed. The light-emitting device 60 includes a first electrode 61, a light-emitting functional layer 62 and a second electrode 63 that are sequentially staked in a direction moving away from the substrate 111. The first electrode 61 is made of a metal with high reflectivity, and the second electrode 63 is made of a transparent conductive film. The description of the light-emitting functional layer 62 is similar to relevant description above, and details will not be repeated here.

In K104, a grating 112 is formed on a side of the light-emitting devices 60 away from the substrate 111. A method for fabricating the grating 112 is similar to the method described above, and details will not be repeated here.

In K105, an encapsulation layer 120 is formed on a side of the grating 112 away from the substrate 111. It will be noted that, the encapsulation layer 120 may be filled into the interval portions 300 of the grating 112. The description of the encapsulation layer 120 is similar to relevant description above, and details will not be repeated here.

The foregoing descriptions are merely specific implementations of the present disclosure, but the protection scope of the present disclosure is not limited thereto. Any person skilled in the art could conceive of changes or replacements within the technical scope of the present disclosure, which shall be included in the protection scope of the present disclosure. Therefore, the protection scope of the present disclosure shall be subject to the protection scope of the claims.

What is claimed is:

1. A display panel comprising:
   a substrate, and a grating disposed on a light-emitting side of the display panel,
   wherein the grating includes a plurality of protruding portions and a plurality of interval portions, each interval portion is located between two adjacent protruding portions;
   the plurality of protruding portions are arranged on the substrate along a first direction, and each protruding portion extends along a second direction perpendicular to the first direction;
   each protruding portion includes an outer surface and a bottom surface;
   the outer surface is a smooth curved surface, and the bottom surface is a flat surface; and
   a cross-sectional figure of each protruding portion along a thickness direction of the display panel is a first figure;
   the first figure includes a curve and a bottom edge, and the first figure is a closed figure formed by the curve and the bottom edge;
   the curve is a cross-sectional figure of the outer surface along the thickness direction of the display panel, and the bottom edge is a cross-sectional figure of the bottom surface along the thickness direction of the display panel,
   wherein each protruding portion includes a first protruding portion and a second protruding portion, and an orthographic projection of the first protruding portion on the substrate is located within an orthographic projection of the second protruding portion on the substrate; and
   the grating includes a first pattern layer and a second pattern layer; the first pattern layer includes a plurality of first protruding portions; and the second pattern layer includes a plurality of second protruding portions,
   wherein the first protruding portion includes a first bottom surface and two side surfaces;
   a cross-sectional figure of the first protruding portion along the thickness direction of the display panel is a second figure; the second figure includes a first bottom edge and two side edges, and the first bottom edge and the two sides edges form a triangle; and
   the first bottom edge is a cross-sectional figure of the first bottom surface along the thickness direction of the display panel, and the two side edges are cross-sectional figures of the two side surfaces along the thickness direction of the display panel,
   wherein the second protruding portion includes the outer surface of a corresponding protruding portion, an inner surface proximate to the first protruding portion, and a second bottom surface; and the inner surface is in contact with and covers the two side surfaces of the first protruding portion;
   a cross-sectional figure of the second protruding portion along the thickness direction of the display panel is a third figure, and the third figure includes the curve, an inner edge, and a second bottom edge; and
   the second bottom edge is a cross-sectional figure of the second bottom surface along the thickness direction of the display panel, and the inner edge is a cross-sectional figure of the inner surface along the thickness direction of the display panel, wherein the bottom surface of the protruding portion includes the first bottom surface and the second bottom surface, and the first bottom surface and the second bottom surface are located in a same plane.

2. The display panel according to claim 1, wherein an included angle θ between a tangent to any point on the curve and any straight line in the thickness direction of the display panel is greater than or equal to 5° and less than 90° (5°≤θ<90°).

3. The display panel according to claim 1, wherein a ratio of a thickness h3 of the protruding portion to a width D3 thereof is greater than or equal to 1 and less than or equal to 5 (1≤h3/D3≤5).

4. The display panel according to claim 3, wherein a ratio of a thickness h1 of the first protruding portion to a width D1 thereof is equal to the ratio of the thickness h3 of the protruding portion to the width D3 thereof.

5. The display panel according to claim 1, wherein a refractive index of the first protruding portion is less than a refractive index of the second protruding portion.

6. The display panel according to claim 5, wherein a constituent material of the first protruding portion is silicon oxide.

7. The display panel according to claim 6, wherein a constituent material of the second protruding portion includes at least one of silicon nitride, titanium dioxide, or aluminum oxide.

8. The display panel according to claim 1, further comprising:
a pixel circuit, the pixel circuit including at least one thin film transistor disposed on the substrate;
a pixel defining layer located on a side of the at least one thin film transistor away from the substrate, the pixel defining layer including a plurality of opening regions; and
a light-emitting device electrically connected to the pixel circuit, the light-emitting device being disposed in an opening region, and the light-emitting device including at least a first electrode, a light-emitting functional layer and a second electrode that are arranged in sequence in a direction moving away from the substrate.

9. The display panel according to claim 8, wherein the light-emitting devices are of a bottom-emission type, and the grating is disposed between the substrate and the at least one thin film transistor.

10. The display panel according to claim 8, wherein the light-emitting devices are of a top-emission type, and the grating is disposed on a side of the second electrode away from the light-emitting functional layer.

11. A display device, comprising:
the display panel according to claim 1;
a cover plate disposed on a sided of the display panel;
a circuit board, the cover plate being disposed on a side of the display panel away from the circuit board; and
a frame, the display panel and the circuit board being disposed in the frame.

12. A method for manufacturing the display panel according to claim 1, the method comprising:
fabricating the grating,
wherein fabricating the grating includes:
providing a debossing template with a debossing pattern;
forming a first film layer and a debossing adhesive layer;
debossing the debossing adhesive layer by using the debossing template to form a debossed pattern;
etching the first film layer by using the debossed pattern as a mask to form the first pattern layer; and
forming the second pattern layer on the first pattern layer so as to form the grating.

13. The method according to claim 12, further comprising:
forming the grating on the substrate, and forming the first film layer and the debossing adhesive layer on the substrate;
forming at least one thin film transistor on a side of the grating away from the substrate;
forming a pixel defining layer on a side of the at least one thin film transistor away from the substrate, the pixel defining layer including a plurality of opening regions; and
forming light-emitting devices, one light-emitting device being disposed in one opening region.

14. The method according to claim 12, further comprising:
forming at least one thin film transistor on the substrate;
forming a pixel defining layer on a side of the at least one thin film transistor away from the substrate, the pixel defining layer including a plurality of opening regions;
forming light-emitting devices, one light-emitting device being disposed in one opening region; and
forming the grating on a side of the light-emitting devices away from the substrate, and forming the first film layer and the debossing adhesive layer on the light-emitting devices.

15. The method according to claim 12, wherein, the debossing template includes a plurality of first rectangular portions, and an interval exists between any two adjacent first rectangular portions;
the debossed pattern obtained by using the debossing template includes a plurality of second rectangular portions and a flat portion located between the plurality of second rectangular portions and the first film layer, and the plurality of second rectangular portions are in one-to-one correspondence with a plurality of intervals between the plurality of first rectangular portions.

16. The method according to claim 15, wherein etching the first film layer by using the debossed pattern as the mask to form the first pattern layer includes:
in a first etching stage, etching away portions of the flat portion corresponding to intervals between the plurality of second rectangular portions; and
in a second etching stage, etching away remaining portions of the flat portion and par of the first film layer to form the first pattern layer.

* * * * *

UNITED STATES PATENT AND TRADEMARK OFFICE
CERTIFICATE OF CORRECTION

PATENT NO. : 11,956,991 B2
APPLICATION NO. : 17/460734
DATED : April 9, 2024
INVENTOR(S) : Jin Zhao et al.

It is certified that error appears in the above-identified patent and that said Letters Patent is hereby corrected as shown below:

In the Claims

Column 20, (Claim 16), Line 55, "par of" should be "part of".

Signed and Sealed this
Second Day of July, 2024

Katherine Kelly Vidal
*Director of the United States Patent and Trademark Office*